United States Patent
Kim

(10) Patent No.: US 11,233,160 B2
(45) Date of Patent: Jan. 25, 2022

(54) PHOTODIODE AND X-RAY SENSOR INCLUDING THE SAME

(71) Applicant: DB HITEK CO., LTD., Seoul (KR)

(72) Inventor: Jong Min Kim, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 15/931,024

(22) Filed: May 13, 2020

(65) Prior Publication Data

US 2020/0365742 A1 Nov. 19, 2020

(30) Foreign Application Priority Data

May 14, 2019 (KR) .......................... 10-2019-0056021

(51) Int. Cl.
*H01L 31/0203* (2014.01)
*H01L 31/02* (2006.01)
*H01L 31/115* (2006.01)

(52) U.S. Cl.
CPC .... *H01L 31/0203* (2013.01); *H01L 31/02002* (2013.01); *H01L 31/115* (2013.01)

(58) Field of Classification Search
CPC ........... H01L 31/0203; H01L 31/02002; H01L 31/115; H01L 27/14658; H01L 27/1463; H01L 27/1461
See application file for complete search history.

(56) References Cited

U.S. PATENT DOCUMENTS

| | | | | |
|---|---|---|---|---|
| 2009/0190014 A1* | 7/2009 | Hong | ................ | H01L 27/14609 348/297 |
| 2009/0303371 A1* | 12/2009 | Watanabe | ......... | H01L 27/14641 348/311 |
| 2011/0181749 A1* | 7/2011 | Yamada | ............ | H01L 27/14647 348/222.1 |
| 2016/0111457 A1* | 4/2016 | Sekine | ............. | H01L 27/14612 257/228 |
| 2018/0033809 A1* | 2/2018 | Tayanaka | .......... | H01L 27/14614 |
| 2018/0190708 A1* | 7/2018 | Lee | ................... | H01L 27/14689 |

* cited by examiner

*Primary Examiner* — Sitaramarao S Yechuri
(74) *Attorney, Agent, or Firm* — Patterson Thuente Pedersen, P.A.

(57) ABSTRACT

An X-ray sensor includes a substrate, a photodiode disposed in the substrate, a reset transistor connected with the photodiode, a source follower transistor connected with the photodiode, and a select transistor connected with the source follower transistor. The photodiode includes a plurality of charge accumulation layers disposed in the substrate and arranged in a direction perpendicular to a surface of the substrate, a plurality of pinning layers disposed on the charge accumulation layers, respectively, and a well region for electrically connecting the charge accumulation layers with the reset transistor and the source follower transistor.

15 Claims, 3 Drawing Sheets

PHOTODIODE AND X-RAY SENSOR INCLUDING THE SAME

CROSS-REFERENCE TO RELATED APPLICATION

This application claims the priority benefit of Korean Patent Application No. 10-2019-0056021, filed on May 14, 2019, and all the benefits accruing therefrom under 35 U.S.C. § 119, the contents of which are incorporated by reference in their entirety.

TECHNICAL FIELD

The present disclosure relates to a photodiode and an X-ray sensor including the same.

BACKGROUND

An X-ray sensor may be classified as a direct conversion type that directly converts X-rays into electrical signals without any conversion process or an indirect conversion type that converts X-rays into visible lights using a scintillator and converts the visible lights into electrical signals. The direct conversion type X-ray sensor may include a photo-conductor for directly converting X-ray photons into electrical signals, and the indirect conversion type X-ray sensor may include a photodiode for detecting the visible lights. For example, a pinned photodiode including a charge accumulation region and a pinning region may be used as the photodiode.

The charge accumulation capacity of the photodiode may be determined by the pinning voltage of the charge accumulation region. The pinning voltage of the charge accumulation region may be determined by the impurity concentration of the charge accumulation region. However, there is a limit to increasing the pinning voltage of the charge accumulation region, and thus there is a limit to increasing the dynamic range of the photodiode.

SUMMARY

The present disclosure provides a photodiode having an increased charge accumulation capacity and a wide dynamic range, and an X-ray sensor including the photodiode.

In accordance with an aspect of the present disclosure, a photodiode may include a plurality of charge accumulation regions, or layers, disposed in a substrate, a plurality of pinning regions disposed adjacent to the charge accumulation regions, respectively, and a well region connected to the charge accumulation regions.

In accordance with some embodiments of the present disclosure, the charge accumulation regions may have different pinning voltages, respectively, such that each of the plurality of charge accumulation regions has a different pinning voltage than the other charge accumulation regions.

In accordance with some embodiments of the present disclosure, at least one of the charge accumulation regions may have a different pinning voltage from at least one remaining charge accumulation region.

In accordance with another aspect of the present disclosure, a photodiode may include a plurality of charge accumulation layers, or regions, having a first conductivity type, disposed in a substrate and arranged in a direction perpendicular to a surface of the substrate, a plurality of pinning layers having a second conductivity type and disposed on the charge accumulation layers, respectively, and a well region having the first conductivity type and connected with the charge accumulation layers.

In accordance with some embodiments of the present disclosure, the well region may be formed through the charge accumulation layers.

In accordance with some embodiments of the present disclosure, the charge accumulation layers may have different pinning voltages, respectively, such that each of the plurality of charge accumulation layers has a different pinning voltage than the other charge accumulation layers.

In accordance with some embodiments of the present disclosure, at least one of the charge accumulation layers may have a different pinning voltage from at least one remaining charge accumulation layer.

In accordance with some embodiments of the present disclosure, the charge accumulation layers may have different impurity concentrations, respectively, such that each of the plurality of charge accumulation layers has a different impurity concentration than the other charge accumulation regions.

In accordance with some embodiments of the present disclosure, the well region may have a pinning voltage higher than the pinning voltage of each of the plurality of charge accumulation layers.

In accordance with some embodiments of the present disclosure, the photodiode may further include a second well region having the second conductivity type and connected with the pinning layers.

In accordance with some embodiments of the present disclosure, the second well region may have a ring shape surrounding the pinning layers.

In accordance with some embodiments of the present disclosure, the photodiode may further include a third well region having the second conductivity type and disposed in the substrate, and the plurality of charge accumulation layers, the plurality of pinning layers, the well region and the second well region may be disposed on the third well region.

In accordance with still another aspect of the present disclosure, an X-ray sensor may include a substrate, a photodiode disposed in the substrate, a reset transistor connected with the photodiode, a source follower transistor connected with the photodiode, and a select transistor connected with the source follower transistor. The photodiode may include a plurality of charge accumulation layers disposed in the substrate and arranged in a direction perpendicular to a surface of the substrate, a plurality of pinning layers disposed on the charge accumulation layers, respectively, and a well region for electrically connecting the charge accumulation layers with the reset transistor and the source follower transistor.

In accordance with some embodiments of the present disclosure, the well region may be formed through the charge accumulation layers.

In accordance with some embodiments of the present disclosure, the photodiode may further include a well contact region disposed on the well region, the charge accumulation layers, the well region and the well contact region have a first conductivity type, and the substrate and the pinning layers have a second conductivity type.

In accordance with some embodiments of the present disclosure, the charge accumulation layers may have different pinning voltages, respectively.

In accordance with some embodiments of the present disclosure, at least one of the charge accumulation layers may have a different pinning voltage from at least one remaining charge accumulation layer.

In accordance with some embodiments of the present disclosure, pinning voltages of the charge accumulation layers may be decreased in a depth direction from the surface of the substrate.

In accordance with some embodiments of the present disclosure, the photodiode may further include a second well region connected with the pinning layers, and a second well contact region disposed on the second well region.

In accordance with some embodiments of the present disclosure, the second well region may have a ring shape surrounding the pinning layers.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
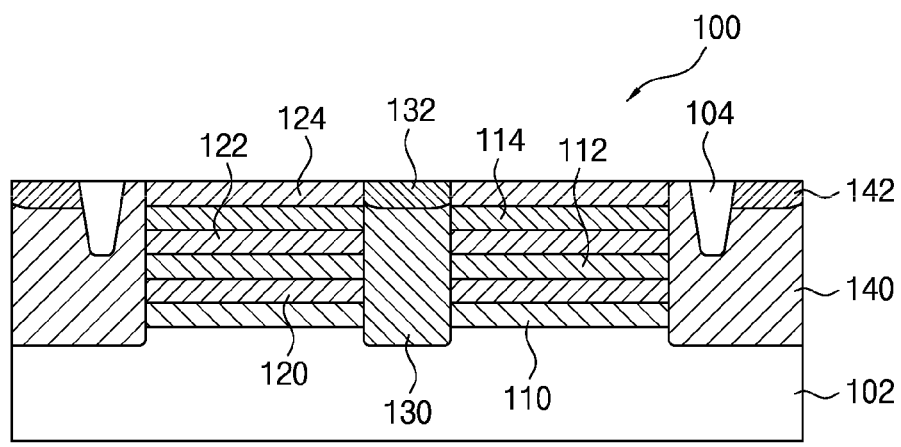
FIG. 1 is a cross-sectional view illustrating a photodiode in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms.

In the specification, when one component is referred to as being on or connected to another component or layer, it can be directly on or connected to the other component or layer, or an intervening component or layer may also be present. In contrast, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
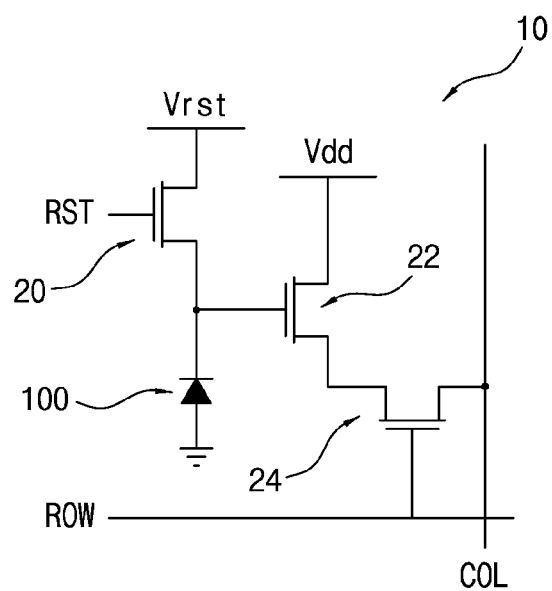
FIG. 2 is a circuit diagram illustrating an X-ray sensor including the photodiode as shown in FIG. 1.

FIG. 1 is a cross-sectional view illustrating a photodiode 100 in accordance with an embodiment of the present disclosure, and FIG. 2 is a circuit diagram illustrating an X-ray sensor 10 including the photodiode 100 as shown in FIG. 1.

Referring to FIGS. 1 and 2, an X-ray sensor 10, in accordance with an embodiment of the present disclosure, may include a substrate 102 and a photodiode 100 formed in the substrate 102. The photodiode 100 may include a plurality of charge accumulation regions 110, 112 and 114 disposed in the substrate 102, a plurality of pinning regions 120, 122 and 124 disposed adjacent to the charge accumulation regions 110, 112 and 114, respectively, and a well region 130 connected with the charge accumulation regions 110, 112 and 114. For example, a plurality of charge accumulation layers 110, 112 and 114 may be formed in the substrate 102. The charge accumulation layers 110, 112 and 114 may have a first conductivity type and may be arranged in a direction perpendicular to a surface of the substrate 102, that is, in a depth direction of the substrate 102. Further, a plurality of pinning layers 120, 122 and 124 having a second conductivity type may be formed on the charge accumulation layers 110, 112 and 114, respectively.

The charge accumulation layers 110, 112 and 114 may be N-type impurity layers formed by an ion implantation process, and the pinning layers 120, 122 and 124 may be P-type impurity layers formed by an ion implantation process. Particularly, the pinning layers 120, 122 and 124 and the charge accumulation layers 110, 112 and 114 may be alternately disposed in the depth direction from the surface of the substrate 102, and thus, the photodiode 100 may include PN junctions between the charge accumulation layers 110, 112 and 114, and the pinning layers 120, 122 and 124.

The substrate 102 may have the second conductivity type. For example, a P-type substrate may be used as the substrate 102. As another example, a P-type epitaxial layer (not shown) may be formed on the substrate 102, and in this case, the photodiode 100 may be formed in the P-type epitaxial layer.

The photodiode 100 may include a well region 130 having the first conductivity type and connected with the charge accumulation layers 110, 112 and 114. For example, the well region 130 may be an N-type impurity region formed by an ion implantation process, and may be formed through the charge accumulation layers 110, 112 and 114, and the pinning layers 120, 122 and 124, as shown in FIG. 1.

Figure 3:
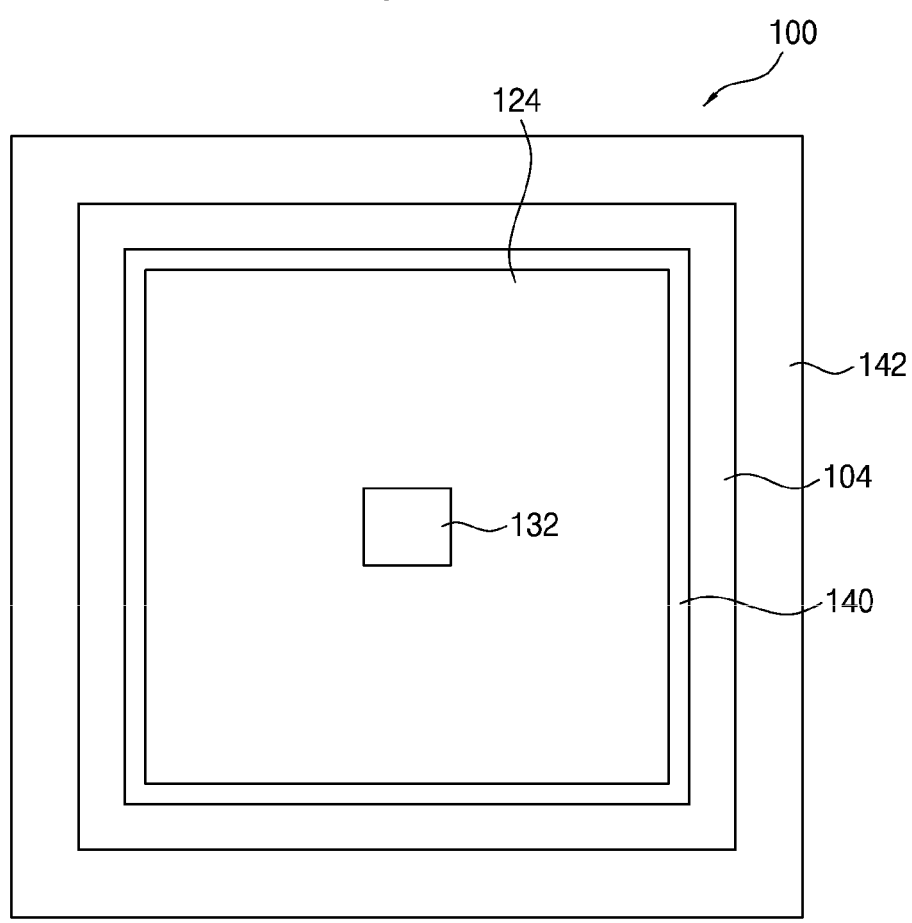
FIG. 3 is a schematic plan view illustrating the photodiode as shown in FIG. 1.

FIG. 3 is a schematic plan view illustrating the photodiode 100 as shown in FIG. 1.

Referring to FIGS. 1 and 3, the photodiode 100 may include a second well region 140 having the second conductivity type and connected with the pinning layers 120, 122 and 124. For example, the second well region 140 may be a P-type impurity region formed by an ion implantation process, and may have a ring shape surrounding the pinning layers 120, 122 and 124.

Referring to FIG. 2, the X-ray sensor 10 may include a reset transistor 20 connected with the photodiode 100, a source follower transistor 22 connected with the photodiode 100, and a select transistor 24 connected with the source follower transistor 22. Though not shown in figures, the reset transistor 20, the source follower transistor and a select transistor 24 may be formed in a transistor region (not shown) disposed adjacent to the photodiode 100, and may include a gate electrode, a gate insulating layer and source/drain regions, respectively.

Particularly, the photodiode 100 may be connected to a source region of the reset transistor 20 and a gate electrode of the source follower transistor 22. A reset voltage Vrst may be applied to a drain region of the reset transistor 20, and a drain voltage Vdd may be applied to a drain region of the source follower transistor 22. A source region of the source follower transistor 22 may be connected to a drain region of the select transistor 24. A gate electrode of the select transistor 24 may be connected to a row signal line (ROW), and a source region of the select transistor 24 may be connected to a column signal line (COL). Meanwhile, a gate electrode of the reset transistor 20 may be connected to a reset signal line (RST).

Referring again to FIG. 1, a well contact region 132 having the first conductivity type may be formed on the well region 130, and a second well contact region 142 having the second conductivity type may be formed on the second well region 140. The reset transistor 20 and the source follower transistor 22 may be electrically connected to the well region 130 and the charge accumulation layers 110, 112 and 114 through the well contact region 132, and the second well region 140 may be grounded through the second well contact region 142. Meanwhile, an isolation region 104 may be formed in the second well region 140, and the second well contact region 142 may be disposed outside the isolation region 104. For example, the isolation region 104 may be a shallow trench isolation region made of an insulating material such as silicon oxide.

The charge accumulation layers 110, 112 and 114 may include a first charge accumulation layer 110 disposed in the substrate 102, a second charge accumulation layer 112 disposed above the first charge accumulation layer 110, and a third charge accumulation layer 114 disposed above the second charge accumulation layer 112. The pinning layers 120, 122 and 124 may include a first pinning layer 120 disposed on the first charge accumulation layer 110, a second pinning layer 122 disposed on the second charge accumulation layer 112, and a third pinning layer 124 disposed on the third charge accumulation layer 114.

Particularly, in accordance with an embodiment of the present disclosure, the charge accumulation layers 110, 112 and 114 may have different pinning voltages, respectively. For example, the first charge accumulation layer 110 may have a first pinning voltage, the second charge accumulation layer 112 may have a second pinning voltage higher than the first pinning voltage, and the third charge accumulation layer 114 may have a third pinning voltage higher than the second pinning voltage. That is, the first, second and third charge accumulation layers 110, 112 and 114 may have pinning voltages that gradually decrease in the depth direction from the surface of the substrate 102, respectively.

The pinning voltages of the first, second and third charge accumulation layers 110, 112 and 114 may be controlled by an impurity concentration. Specifically, the first, second and third charge accumulation layers 110, 112 and 114 may have different impurity concentrations, respectively. For example, the first charge accumulation layer 110 may have a first impurity concentration, the second charge accumulation layer 112 may have a second impurity concentration higher than the first impurity concentration, and the third charge accumulation layer 114 may have a third impurity concentration higher than the second impurity concentration.

The photodiode 100 may be reset to a reset voltage Vrst by the operation of the reset transistor 20. In this case, the reset voltage Vrst may be the same as the drain voltage Vdd, and the third pinning voltage may be equal to or less than the reset voltage Vrst so that the first, second and third charge accumulation layers 110, 112 and 114 are fully or sufficiently depleted. Meanwhile, the well region 130 may have a fourth impurity concentration higher than the third impurity concentration and a fourth pinning voltage higher than the third pinning voltage. Particularly, the fourth pinning voltage may be equal to or greater than the reset voltage Vrst.

Thought not shown in figures, the X-ray sensor 10 may include a scintillator layer (not shown) for converting an X-ray into a visible light, and the visible light converted by the scintillator layer may be incident on, or strike, the photodiode. After the photodiode 100 is reset, the visible light may be incident on the photodiode 100, and electrons generated by the visible light may be accumulated in the photodiode 100.

Figure 4:
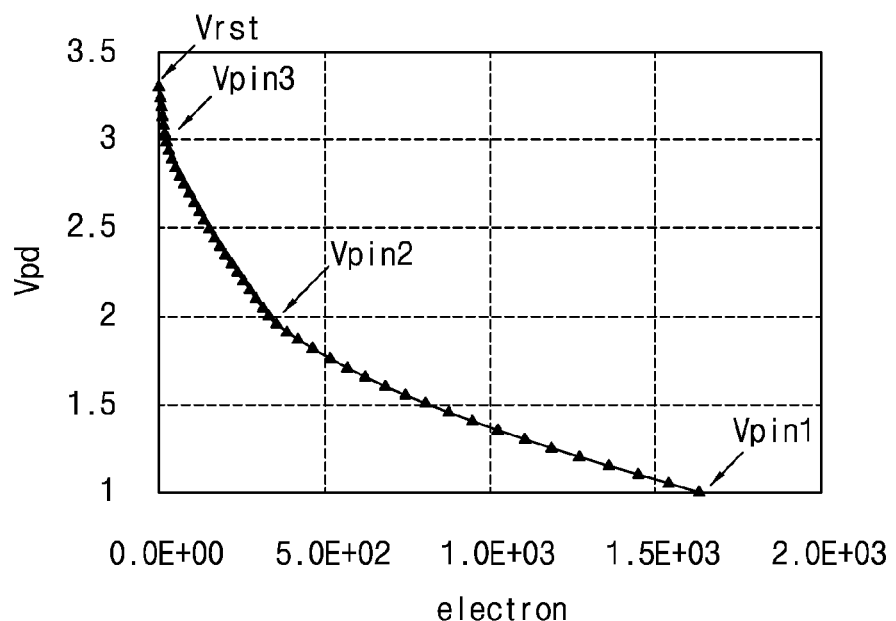
FIG. 4 is a graph illustrating the number of electrons accumulated in a photodiode and a photodiode voltage Vpd.

FIG. 4 is a graph illustrating the number of electrons accumulated in the photodiode 100 and a photodiode voltage Vpd.

Referring to FIG. 4, for example, the photodiode 100 may be reset to a reset voltage Vrst of about 3.3V. Further, the first pinning voltage Vpin1 may be about 1V, the second pinning voltage Vpin2 may be about 2V, and the third pinning voltage Vpin3 may be about 3V. After the photodiode 100 is reset to the reset voltage Vrst, electrons generated by the incidence of the visible light may be accumulated in the photodiode 100. In such a case, the electrons may be accumulated in the well region 130 while a photodiode voltage Vpd is dropped from the reset voltage Vrst (about 3.3V) to the third pinning voltage Vpin3 (about 3V), and may be accumulated in the well region 130 and the third charge accumulation layer 114 while the photodiode voltage Vpd is dropped from the third pinning voltage Vpin3 (about 3V) to the second pinning voltage Vpin2 (about 2V). Further, the electrons may be accumulated in the well region 130, the third charge accumulation layer 114 and the second charge accumulation layer 112 while the photodiode voltage Vpd is dropped from the second pinning voltage Vpin2 (about 2V) to the first pinning voltage Vpin1 (about 1V). Though not shown in FIG. 4, when the photodiode Vpd falls below the first pinning voltage Vpin1 (about 1V), the electrons may be accumulated in the well region 130, the third charge accumulation layer 114, the second charge accumulation layer 112 and the first charge accumulation layer 110.

As shown in FIG. 4, as the photodiode voltage Vpd decreases, the full well capacity (FWC) of the photodiode 100 may be significantly increased, and the number of the electrons accumulated in the first, second and third charge accumulation layers 110, 112 and 114 may thus be significantly increased. That is, the charge accumulation capacity of the photodiode 100 may be significantly increased, and the dynamic range of the photodiode 100 may thus be significantly widened.

As described above, the photodiode 100 includes three charge accumulation layers 110, 112 and 114, and three pinning layers 120, 122 and 124, but the number of the charge accumulation layers and the number of pinning layers may be variously changed. For example, the photodiode 100 may include two, four, or any other number of charge accumulation layers, and two, four, or any other number of pinning layers.

Further, at least one of the charge accumulation layers 110, 112 and 114 may have a pinning voltage different from at least one remaining accumulation layer. For example, the first charge accumulation layer 110 may have a first pinning voltage, and the second and third charge accumulation layers 112 and 114 may have a second pinning voltage higher than the first pinning voltage. Alternatively, when the photodiode 100 includes four charge accumulation layers, first and second charge accumulation layers may have a first pinning voltage, and third and fourth charge accumulation layers may have a second pinning voltage higher than the first pinning voltage.

Figure 5:
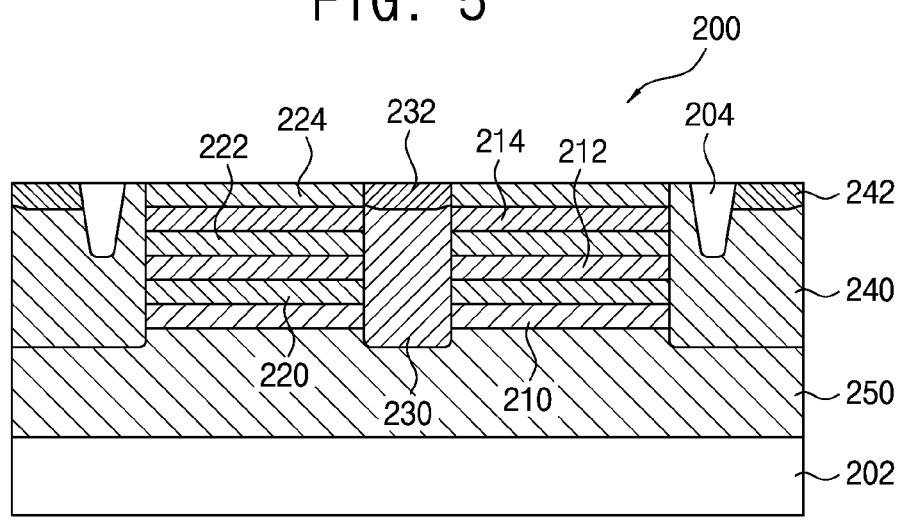
FIG. 5 is a cross-sectional view illustrating a photodiode in accordance with an embodiment of the present disclosure.

FIG. 5 is a cross-sectional view illustrating a photodiode 200 in accordance with another embodiment of the present disclosure.

Referring to FIG. 5, a photodiode 200, in accordance with another embodiment of the present disclosure, may include a plurality of charge accumulation regions 210, 212 and 214 formed in a substrate 202, a plurality of pinning regions 220, 222 and 224 formed on the charge accumulation regions 210, 212 and 214, respectively, and a well region 230 connected with the charge accumulation regions 210, 212 and 214. For example, the charge accumulation layers 210, 212 and 214, and the well region 230 may be P-type impurity layers formed by an ion implantation process, and the pinning layers 220, 222 and 224 may be N-type impurity layers formed by an ion implantation process.

The photodiode 200 may include a second well region 240 connected with the pinning layers 220, 222 and 224, and a third well region 250 formed in the substrate 202. In this case, the charge accumulation layers 210, 212 and 214, the pinning layers 220, 222 and 224, the well region 230, and the second well region 240 may be formed on the third well region 250. For example, the second well region 240 and the third well region 250 may be N-type impurity regions, and the second well region 240 may have a ring shape surrounding the pinning layers 220, 222 and 224.

Further, a well contact region 232 may be formed on the well region 230, and a second well contact region 242 may be formed on the second well region 240. An isolation region 204 may be formed in the second well region 240, and the second well contact region 242 may be disposed outside the isolation region 204. The substrate 202 may be a P-type substrate. Alternatively, a P-type epitaxial layer (not shown) may be formed on the substrate 102, and in this case, the photodiode 200 may be formed in the P-type epitaxial layer.

Although the photodiode and the X-ray sensor including the same been described with reference to specific embodiments as described above, they are not limited thereto. Therefore, it will be readily understood by those skilled in the art that various modifications and changes can be made thereto without departing from the spirit and scope of the present disclosure defined by the appended claims.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. A photodiode comprising:
   a plurality of charge accumulation layers having a first conductivity type, disposed in a substrate and arranged in a direction perpendicular to a surface of the substrate;
   a plurality of pinning layers having a second conductivity type and disposed on the charge accumulation layers, respectively;
   a well region having the first conductivity type and connected with the charge accumulation layers; and
   a second well region having the second conductivity type and connected with the plurality of pinning layers.

2. The photodiode of claim 1, wherein the well region is formed through the charge accumulation layers.

3. The photodiode of claim 1, wherein each of the plurality of charge accumulation layers has a different pinning voltage than the other charge accumulation layers.

4. The photodiode of claim 1, wherein at least one of the charge accumulation layers has a different pinning voltage from at least one remaining charge accumulation layer.

5. The photodiode of claim 1, wherein each of the plurality of charge accumulation layers has a different impurity concentration than the other charge accumulation layers.

6. The photodiode of claim 1, wherein the well region has a pinning voltage higher than a pinning voltage of the plurality of charge accumulation layers.

7. The photodiode of claim 1, wherein the second well region has a ring shape surrounding the plurality of pinning layers.

8. The photodiode of claim 1, further comprising a third well region having the second conductivity type and disposed in the substrate,
wherein the plurality of charge accumulation layers, the plurality of pinning layers, the well region and the second well region are disposed on the third well region.

9. An X-ray sensor comprising:
a substrate;
a photodiode disposed in the substrate;
a reset transistor connected to the photodiode;
a source follower transistor connected to the photodiode; and
a select transistor connected to the source follower transistor,
wherein the photodiode comprises:
   a plurality of charge accumulation layers disposed in the substrate and arranged in a direction perpendicular to a surface of the substrate;
   a plurality of pinning layers disposed on the charge accumulation layers, respectively;
   a well region for electrically connecting the charge accumulation layers with the reset transistor and the source follower transistor;
   a second well region connected to the pinning layers; and
   a second well contact region disposed on the second well region.

10. The X-ray sensor of claim 9, wherein the well region is formed through the plurality of charge accumulation layers.

11. The X-ray sensor of claim 9, wherein the photodiode further comprises a well contact region disposed on the well region,
   the plurality of charge accumulation layers, the well region and the well contact region have a first conductivity type, and
   the substrate and the plurality of pinning layers have a second conductivity type.

12. The X-ray sensor of claim 9, wherein each of the plurality of charge accumulation layers has a different pinning voltage than the other charge accumulation layers.

13. The X-ray sensor of claim 9, wherein at least one of the charge accumulation layers has a different pinning voltage from at least one remaining charge accumulation layer.

14. The X-ray sensor of claim 9, wherein pinning voltages of the plurality of charge accumulation layers are decreased in a depth direction from the surface of the substrate.

15. The X-ray sensor of claim 9, wherein the second well region has a ring shape surrounding the plurality of pinning layers.

* * * * *